United States Patent [19]
Pletz-Kirsch et al.

[11] Patent Number: 5,065,115
[45] Date of Patent: Nov. 12, 1991

[54] DIGITAL PHASE-LOCKED LOOP

[75] Inventors: Gerhard Pletz-Kirsch; Jürgen Lenth, both of Hamburg, Fed. Rep. of Germany

[73] Assignee: U.S. Philips Corporation, New York, N.Y.

[21] Appl. No.: 616,455

[22] Filed: Nov. 20, 1990

[30] Foreign Application Priority Data

Nov. 24, 1989 [DE] Fed. Rep. of Germany ....... 3938886

[51] Int. Cl.$^5$ ............................................. H03L 7/14
[52] U.S. Cl. ..................................... 331/14; 331/1 A; 331/17; 331/20
[58] Field of Search ..................... 331/1 A, 14, 17, 18, 331/20, 25

[56] References Cited

U.S. PATENT DOCUMENTS 3,882,412  5/1975  Apple, Jr. .......................... 331/1 A Primary Examiner—David Mis
Attorney, Agent, or Firm—Bernard Franzblau

[57] ABSTRACT

A digital phase-locked loop comprises a phase comparator, a controllable oscillator whose output signal is compared with an input signal in the phase comparator, and a loop filter preceding the oscillator. The filter comprises a clocked input register for storing the last phase-measuring value of the phase comparator, and an integrator which comprises a clocked register whose output signal is fed back to the register input. When the input signal of the phase comparator is absent or disturbed, a switching signal is generated which immediately erases the input register in the loop filter and after whose appearance the register in the integrator of the loop filter is reset to zero within a limited number of clock cycles.

10 Claims, 1 Drawing Sheet

DIGITAL PHASE-LOCKED LOOP

BACKGROUND OF THE INVENTION

This invention relates to a digital phase-locked loop comprising a phase comparator, a controllable oscillator whose output signal is compared with an input signal in the phase comparator, and a loop filter preceding the oscillator, which filter comprises a clocked input register for storing the last phase-measuring value of the phase comparator, and an integrator which comprises a clocked register whose output signal is fed back to the register input.

Phase-locked loops (PLLs) present a problem in the absence of the input signal or in the case of a distrubed input signal to the phase comparator. In that event, when this signal is compared in the phase comparator with the output signal of the controllable oscillator, the phase comparator supplies an erroneous or accidental output signal which causes the frequency of the controllable oscillator to fluctuate or to vary between its minimum and maximum frequency values. These effects are undesirable. In contrast, it is desirable for the oscillator to oscillate at its rated frequency.

For an analog phase-locked, loop a circuit arrangement is known from U.S. Pat. No. 3,882,412 which in the absence of the input signal of the phase comparator attempts to keep the oscillator at the last adjusted frequency. This is effected by means of a digital circuit which stores the last, actual measured value and supplies it to the phase-locked loop in the absence of the input signal. However, such an arrangement is not suitable for digital loop filters. This applies particularly to digital loop filters having a recursive function.

SUMMARY OF THE INVENTION

It is an object of the invention to provide a digital phase-locked loop whose controllable oscillator also supplies a signal of a defined frequency when the input signal of the phase comparator is absent or when it is disturbed.

According to the invention this object is achieved in that in the absence of the input signal of the phase comparator, or in the case of a disturbed input signal, a switching signal is generated which immediately erases the input register in the loop filter and after its appearance the register in the integrator of the loop filter is reset to zero within a limited number of clock cycles.

If the input signal applied to the phase comparator is disturbed, for example, if it is noisy, or if it is absent, the phase discriminator supplies strongly fluctuating values or, dependent on the structure of the phase discriminator, supplies each time the last phase-measuring result. To obviate the resultant consequences (erroneous or fluctuating frequency of the oscillator), the input register of the loop filter is immediately erased. If the loop filter is constructed in such a way that it does not only supply the integral portion but also a proportional portion, this proportional portion is reset to zero when the input register of the loop filter is erased.

The integrator in the loop filter would, however, still supply an output signal after the input register has been erased, namely the signal which it supplied before the input register was erased. Therefore, the register in the integrator is reset after the switching signal has occurred. This should not be effected immediately but at the latest within a limited number of clock cycles. Resetting may be alternatively effected in steps. The register should thus not be erased completely within one clock cycle.

If also the register of the integrator is erased, the loop filter supplies no output signal or it supplies the output signal zero so that the subsequently arranged controllable oscillator oscillates at its rated frequency.

For example, the level of the input signal can be utilized to generate the switching signal.

A digital phase-locked loop of this type is advantageously suitable, for example, in a television receiver having a phase-locked loop for controlling the horizontal deflection and which may be implemented in accordance with the invention. For a television receiver this has the additional advantage that in the absence of an input signal, or in the case of a noisy input signal, the horizontal deflection operates at the rated frequency so that picture or character superpositions remain possible. For television applications the switching signal may be generated, for example, dependent on whether the synchronizing pulses are correctly recognized or are not recognized.

In accordance with a further embodiment of the invention the switching signal immediately erases the register in the integrator. In this case the output signal of the loop filter is reset to zero immediately after the switching signal has occurred because the integrator also no longer supplies an output signal.

A further embodiment of the invention is characterized in that from the instant of appearance of the switching signal the output signal of the register in the integrator is fed back to the register input after multiplication by a negative factor.

If the output signal of the register in the integrator is fed back to the register input after the switching signal has appeared and after multiplication by a negative factor, the register contents are reduced over a plurality of clock cycles until the value of zero is reached. As a result, the output signal of the integrator and hence that of the loop filter is slowly reduced to zero. This is particularly advantageous for applications in which rapid changes of the oscillator frequency are undesirable. This particularly applies to the above-mentioned case of the television receiver in which the horizontal frequency may only change slowly in order that the horizontal deflection output stages are not overloaded.

BRIEF DESCRIPTION OF THE DRAWING

Two embodiments of the invention will be described in greater detail with reference to the accompanying drawings, in which.

DESCRIPTION OF THE PREFERRED EMBODIMENTS

Figure 1:
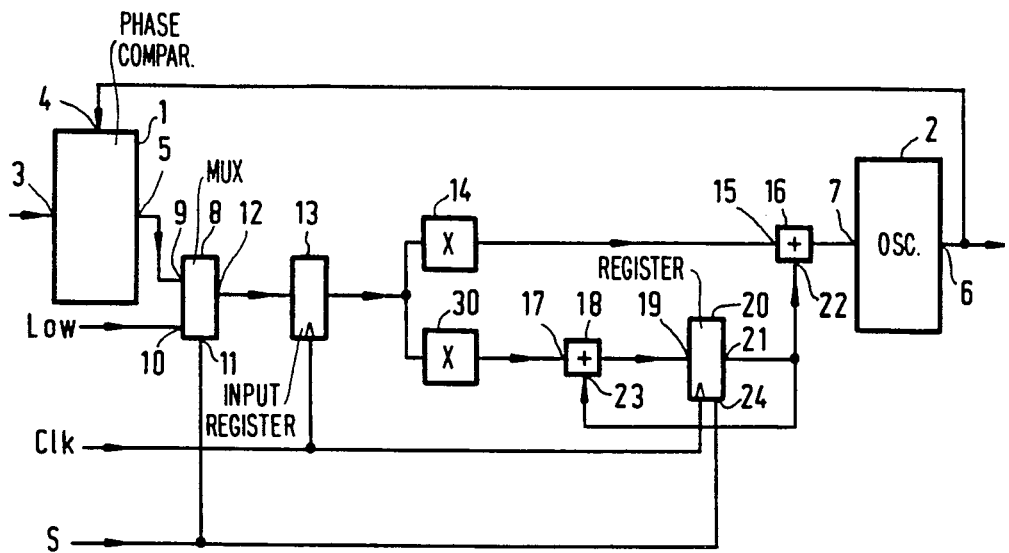
FIG. 1 shows a first embodiment of a digital phase-locked loop in which the register of the integrator is immediately erased after the switching signal has occurred.

A phase-locked loop shown in FIG. 1 comprises a phase comparator 1 and a controllable oscillator 2 which operate in known manner and are only shown diagrammatically in the Figure. The phase comparator 1 has a first input 3 at which an input signal is present whose frequency and phase position are compared in the phase comparator with a signal which is present at a second input 4. The output 5 of the phase comparator supplies the measured result. The signal which is present at its input 4, and which is compared with the input signal present at the input 3, is the signal appearing at an output 6 of the oscillator, which signal is also the output signal of the digital phase-locked loop.

The output signal appearing at the output 5 of the phase comparator 1 is applied to a loop filter shown in detail in the Figure, in which filter the signal is filtered before it is available at an input 7 of the controllable oscillator 2.

The loop filter is particularly used for the purpose of influencing the properties of the digital phase-locked loop in the desired manner.

A multiplexer 8, having a first input 9 connected to the output 5 of the phase comparator 1, is arranged at the input of the digital loop filter. A fixed low-level signal is applied to a second input 10 of the multiplexer 8. A further input 11 of the multiplexer receives a switching signal S which controls whether the input signal at its input 9 or the input signal at its input 10 is applied to an output 12 of the multiplexer 8. This is effected in such a way that the first input 9 is connected to the output 12 in the case of a low level of the switching signal S and the second input 10 is connected to the output 12 of the multiplexer 8 in the case of a high level of the switching signal S.

The signal occurring at the output 12 of the multiplexer 8 is applied to an input register 13 of the loop filter. The input register 13 is clocked by means of a clock signal Clk. The output signal of the input register 13 is applied to a first multiplier 14 and to a second multiplier 30. The output signal of the multiplier 14 is applied to a first input 15 of an adder 16.

The output signal of the multiplier 30 is applied to a first input 17 of a further adder 18. The output signal of the adder 18 is applied to an input 19 of a register 20. An output 21 of the register 20 is connected to a second input 22 of the adder 16 and also to a second input 23 of the adder 18. The switching signal Clk is applied to the register 20 as well as to the register 13. The switching signal S is applied to a further input 24 of the register 20, as well as to the multiplexer 8. The register 20 is erased by means of this switching signal S when the switching signal S changes a low level to a high level.

The digital phase-locked loop shown in FIG. 1 operates as follows:

In the comparator 1 the input signal applied to an input 3 is compared in frequency and phase position with the output signal of the oscillator 2. If this input signal has a sufficient level and if it is not disturbed, this switching signal S has a low level. The multiplexer 8 then applies the output signal of the phase comparator to the input register into which this signal, which is clocked by means of signal Clk, is read. The output signal of the register 13 is applied to the multiplier 14 whose output is connected to the adder 16. A value which is proportional to the output signal of the register 13 reaches the adder 16 via this path, i.e. it reaches the output of the loop filter. Furthermore, the register output signal is applied to an integrator which comprises the adder 18 and the register 20. A multiplier also precedes the integrator. The integrator operates in such a way that the signal provided by the multiplier 30 is read into the register while adding the output signal of the register. Thus, there is a recursive function. The proportional part made available by the multiplier 14 and the integral part made available by the integrator are added in the adder 16 and applied to the oscillator 2. By a suitable choice of the factors of the multipliers 14 and 30, the proportional and integral parts are proportionally adjustable with respect to each other. This adjustment particularly enables the attenuation and the natural frequency of the loop filter to be adjusted.

For the function described so far it has been assumed that the input signal which is present at the input 3 of the phase comparator 1 has a sufficient level and is not disturbed. However, if this is not the case, i.e. if the input signal is absent or is no longer present or if it is disturbed, for example, noisy, a switching signal S is generated in known manner. The embodiment shown in the Figure is based on the assumption that the switching signal S changes from low level to high level when the input signal of the phase comparator is absent or when it is disturbed. The multiplexer 8 is then switched to its second input 10. As a result, the low-level signal which is present at this input is applied to the register 13 into which it is read by means of the next clock signal Clk. As a result of erasing the input register 13, the proportional part is immediately reduced to zero. After the input register 13 has been erased, a zero thus immediately appears at the input 15 of the adder 16. In order that a zero also appears at the output 21 of the register 20, thus at the output of the integrator, the register 20 is erased by means of the switching signal S which is applied to the input 24. The integral part is then also reduced to zero. The register contents of the integrator 20 also remain at zero in the further clock cycles of the signal Clk, so that the output signal of the adder 16 and hence the signal at the input 7 of the controllable oscillator 2 permanently remains at zero. Consequently, the controllable oscillator 2 oscillates at its rated frequency.

Figure 2:
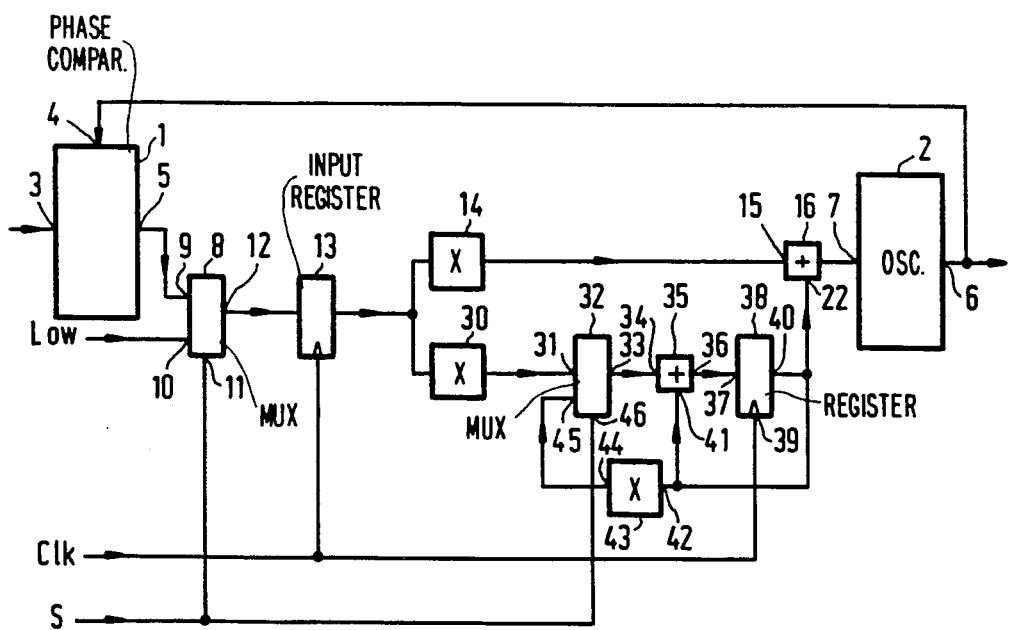
FIG. 2 shows a second embodiment of a digital phase-locked loop in which the register in the integrator is erased over a plurality of clock cycles.

A digital phase-locked loop shown in FIG. 2 is different from the phase-locked loop shown in FIG. 1. More particularly, the register in the integrator is not immediately erased when the switching signal S occurs, but instead it is erased in steps through a plurality of clocks of the signal Clk.

The phase-locked loop shown in FIG. 2 is arranged in the same manner as the phase-locked loop of FIG. 1 as far as the phase comparator 1, the multiplexer 8, the input register 13, the multiplier 14, the multiplier 30, the adder 16 and the controllable oscillator 2 are concerned. However, the integrator of the phase-locked loop shown in FIG. 2 has a different structure.

The output signal of the multiplier 30 is applied to a first input 31 of a multiplexer 32. An output 33 of the multiplexer 32 is connected to a first input 34 of an adder 35 whose output 36 is connected to an input 37 of a register 38. The register 38 is clocked by means of the clock signal Clk applied to its input 39. An output 40 of the register 38 is connected to the second input 22 of the adder 16, to a second input 41 of the adder 35 and to an input 42 of a multiplier 43. An output 44 of the multiplier 43 is connected to a second input 45 of the multiplexer 32. The switching signal S is applied to a switching input 46 of the multiplexer 32.

The loop filter shown in FIG. 2 operates in the same way as the loop filter shown in FIG. 1 as far as the multiplexer 8, the input register 13 and the multiplier 14 are concerned, by means of which a proportional part of the input signal of the loop filter is applied to the adder 16. The integral part of the signal applied to the second input 22 of the adder 16 is, however, derived in a slightly different way.

It will be assumed initially that the switching signal S has a low level, i.e. the input signal of the phase comparator 1 is not disturbed and has a sufficient level. The multiplexer 32 is then switched to its first input 31. Via the adder 35, the output signal of the multiplexer 32 reaches the register 38 whose output signal is also applied to the adder 35. So far the way in which the integrator operates is identical to that of the integrator shown in FIG. 1.

However, if the switching signal S switches from a low level to a high level, the multiplexer 32 is switched to its second input 45, i.e. the input signal which is present at this input is applied to the output 33. The first input 34 of the adder 35 thus receives the output signal of the register 40, which signal is multiplied in the multiplier 43 by a negative factor which is smaller than $-1$. Since the unchanged output signal of the register 38 is applied to the second input of the adder 41 as before, the output 36 of the adder 35 thus supplies an output signal which is slightly smaller than the output signal of the register 40. Since this output signal of the adder 36 is read into the register 38 with each clock Clk, the memory contents of the register 38 are slightly reduced with each clock cycle. The extent of reduction is adjustable by means of the factor with which the multiplier 43 operates. In any case, however, the factor should be smaller than $-1$ because only then are the memory contents of the register 38 reduced. The choice of the factor provides the possibility of influencing the time period after which the controllable oscillator 2 oscillates at its rated frequency again after failure or disturbance of the input signal applied to the phase comparator 1. Thus, this loop filter has the further advantage that the oscillator slowly returns to its rated frequency again after failure or disturbance of the input signal. The time in which this is effected can be influenced by means of the factor of the multiplier 43.

This property of the digital phase-locked loop shown in FIG. 2 is significant for many application because a too rapid change of the frequency of the output signal of the oscillator 2 is often undesirable. This applies, for example, to applications in television receivers in which the frequency of the phase-locked loops used for the vertical or horizontal deflection should not be change too much with time, because otherwise the deflection output stages are overloaded.

We claim:

1. A digital phase-locked loop comprising: a phase comparator, a controllable oscillator whose output signal is compared with an input signal in the phase comparator, a loop filter preceding the oscillator, which filter comprises a clocked input register for storing the last phase-measuring value of the phase comparator, and an integrator which comprises a clocked further register whose output signal is fed back to the further register input, characterized in that in the absence of the input signal of the phase comparator or in the case of a disturbed input signal a switching signal is generated which immediately erases the input register in the loop filter and which, after its appearance, resets the further register in the integrator of the loop filter to zero within a limited number of clock cycles.

2. A digital phase-locked loop as claimed in claim 1, characterized in that the switching signal immediately erases the further register in the integrator.

3. A digital phase-locked loop as claimed in claim 1, characterized in that from the instant of appearance of the switching signal the output signal of the further register in the integrator is fed back to the further register input via a multiplier which provides multiplication by a negative factor.

4. A digital phase-locked loop as claimed in claim 3, characterized in that the further register in the integrator is preceded by an adder to which the output signal of the further register and the output signal of a multiplexer are applied, which multiplexer has a first input to which the signal to be integrated is applied, and a second input to which is applied the output signal of the integrator multiplied in the multiplier by a negative factor which is smaller than $-1$, and in that the output of the multiplexer conveys the signal applied to its second input during the period when the switching signal is generated and conveys the signal applied to its first input during other periods.

5. A digital phase-locked loop as claimed in claim 1 wherein said loop filter comprises the input register, a first multiplier and a first adder coupled in cascade between an output of the phase comparator and an input of the controllable oscillator, and wherein said integrator comprises a second multiplier, a second adder and said further register coupled in cascade between an output of the input register and an input of the first adder, and wherein the output signal of the further register is fed back to its input via said second adder.

6. A digital phase-locked loop as claimed in claim 5 wherein a clock signal is applied to said input register and said further register.

7. A digital phase-locked loop as claimed in claim 1 wherein said integrator comprises a first multiplier, a switching device, an adder and said further register coupled in cascade between an output of the input register and an input of the controllable oscillator, said digital phase locked loop further comprising a second multiplier coupled between an output of the further register and an input of the switching device, said switching device being controlled by the switching signal to pass an output signal of the second multiplier when the switching signal is generated and to pass an output signal of the first multiplier at other times.

8. A digital phase-locked loop as claimed in claim 7 wherein said loop filter comprises the input register and a third multiplier coupled in cascade between an output of the phase comparator and the input of the controllable oscillator.

9. A digital phase-locked loop as claimed in claim 7 wherein the second multiplier multiplies its input signal by a negative factor and said further register is clocked by a clock signal whereby the contents of the further register are reduced as a function of said negative factor at each clock signal.

10. A digital phase-locked loop as claimed in claim 1 wherein said integrator comprises means including said further register for resetting said further register to zero in a plurality of steps synchronized with a clock signal.

* * * * *